United States Patent
Lee

(10) Patent No.: US 6,634,093 B1
(45) Date of Patent: Oct. 21, 2003

(54) MOUNTER HEAD OF SURFACE MOUNTING APPARATUS

(75) Inventor: Dong Suh Lee, Seoul (KR)

(73) Assignee: Mirae Corporation, Choongchungnam-Do (KR)

( * ) Notice: Subject to any disclaimer, the term of this patent is extended or adjusted under 35 U.S.C. 154(b) by 0 days.

(21) Appl. No.: 09/534,628

(22) Filed: Mar. 27, 2000

(30) Foreign Application Priority Data

Apr. 1, 1999 (KR) ........................................ 1999-11395
Apr. 1, 1999 (KR) ........................................ 1999-11399

(51) Int. Cl.$^7$ .......................... H05K 3/30; H05K 13/04
(52) U.S. Cl. .................... 29/740; 29/741; 29/743; 29/721; 294/2; 294/64.1; 901/40
(58) Field of Search ................. 29/740, 743, 721, 29/741, 739, DIG. 44; 294/64.1, 2; 414/737, 752; 901/40

(56) References Cited

U.S. PATENT DOCUMENTS

| | | | | |
|---|---|---|---|---|
| 4,945,958 A | * | 8/1990 | Shoda .......................... 144/1 |
| 5,172,468 A | * | 12/1992 | Tanaka et al. ................ 29/721 |
| 5,233,745 A | * | 8/1993 | Morita .......................... 29/705 |
| 5,566,447 A | * | 10/1996 | Sakurai ........................ 29/832 |
| 5,657,533 A | * | 8/1997 | Fukui et al. .................. 29/740 |
| 5,840,594 A | * | 11/1998 | Tsubouchi et al. ........... 438/15 |
| 5,894,657 A | * | 4/1999 | Kanayama et al. | |
| 5,924,192 A | * | 7/1999 | Wuyts .......................... 29/833 |
| 6,209,194 B1 | * | 4/2001 | Kang et al. ................... 29/739 |
| 6,308,403 B1 | * | 10/2001 | Hwang ......................... 29/740 |
| 6,490,787 B1 | * | 12/2002 | Ohashi et al. ................ 29/833 |

FOREIGN PATENT DOCUMENTS

JP        2000/288969       * 10/2000

* cited by examiner

Primary Examiner—Peter Vo
Assistant Examiner—Minh Trinh
(74) Attorney, Agent, or Firm—Fleshner & Kim, LLP

(57) ABSTRACT

A mounter head is provided for a surface mounting apparatus which is capable of easily controlling a pitch of a mounting device as well as preventing backlash when the device is mounted on a printed circuit board. The mounter head includes a rack block having a rack for moving up and down by means of a pinion rotated by a driving source; a nozzle shaft installed at one side of the moving unit; a nozzle secured to the lower end of the nozzle shaft for sucking a device to be mounted; and a driving source installed corresponding to each nozzle shaft for rotating each nozzle.

13 Claims, 3 Drawing Sheets

MOUNTER HEAD OF SURFACE MOUNTING APPARATUS

BACKGROUND OF THE INVENTION

1. Field of the Invention

The present invention relates to a mounter head for a surface mounting apparatus which is capable of easily controlling a pitch of the surface mounting apparatus as well as preventing backlash when the apparatus is mounted on a printed circuit board.

2. Description of the Prior Art

Electric and electronic products have been developing rapidly with high density, small size and variety. Development of surface mounting technology using a surface mounting apparatus for manufacturing a Printed Circuit Board (PCB) has also developed rapidly.

The surface mounting apparatus is a very important component of the surface mounting assembly apparatus for mounting a surface mounting device to the PCB and is supplied with the surface mounting device from a device supplier, which feeds it to a mounting position on the PCB and mounts it on the PCB.

The surface mounting apparatus can be divided by function into high-speed apparatus and general-use apparatus. The high-speed apparatus can accomplish a high-speed mounting operation because it is constructed to assemble many devices in a short period of time. Therefore, it has the advantage that it can be utilized for mass production. However, its mounting precision may be reduced.

Meanwhile, the general-use apparatus can accomplish a high-precision mounting operation because it is constructed to function with many devices. Therefore, it has the advantage that it can be utilized for medium or small production. However, productivity may be reduced because of the low-speed mounting operation.

A surface mounting apparatus comprises a feeder (referring to "a tape feeder" as below) for supplying a device to be mounted, an X-Y gentry for determining a working position, a conveyor for carrying a PCB and a head for picking up, in regular sequence, a device from the feeder and for mounting the device on the PCB. In general, the surface mounting apparatus serves to mount an electronic device on the PCB and can be called a mounter. More detailed structure for the mounter is as follows.

The mounter comprises a base assay, a conveyor installed at an upper portion of the base assay for feeding a PCB, a feeder for supplying a device or a chip to be mounted on the PCB, a mounter head assay for mounting each device supplied from the feeder, a vision part for acknowledging and correcting the position of the device, and an X-Y gentry installed with the vision part and the mounter head for determining the position of the table.

Meanwhile, the mounter head assay comprises driving means for driving the mounter head, a suction nozzle for directly sucking the device, nozzle fixing means for fixing the sucked device, and a nozzle exchanging apparatus for exchanging the nozzle.

The mounter head is constructed to rotate about a R-axis 360 degrees, as shown by arrow R in FIG. 1, to control the rotation angle of the device sucked by the nozzle and along a Z-axis, as shown by arrow Z in FIG. 1, for moving up and down to suck the device by the nozzle The suction nozzle of the mounter head is installed on the nozzle shaft and is rotatable by 360 degrees. The nozzle shaft is rotated on the R-axis by the driving means and is moved up and down on the Z-axis by the pinion and the rack by other driving means.

However, the conventional mounter head provides one driving means for rotation pf each of the nozzle shafts about the R-axis. Each nozzle shaft is rotated about the R-axis after the driving motor is connected to the nozzle shaft by a belt. That is, although the first nozzle shaft, which is connected to the driving means correctly receives the rotation angle from the driving means, errors often occur in the rotation of the second, third, and fourth nozzles due to backlash caused by belt slip and the distance between the respective nozzle and the belt. Therefore, the rotating angle of the nozzle shaft can be precisely controlled, thereby causing the device not to be correctly sucked or mounted when the surface mounting device is mounted on the PCB.

Therefore, the conventional surface mounting apparatus has the problem of inefficient mounting and the device thus may not work properly.

Further, the surface mounting device can be divided into a semiconductor device being supplied from a tape feeder and a semiconductor devices being supplied from a tray feeder.

That is, in case of a semiconductor device supplied from a tape feeder, the surface mounting device is supplied with devices from supply rolls. Each roll is disposed at a predetermined distance therefrom, thereby having the same pitch. Accordingly, each nozzle can suck only one device at a time.

FIG. 1 shows the structure of a mounter head of a conventional surface mounting apparatus filed by Yamaha in Japan and issued as U.S. Pat. No. 5,377,405. The surface mounting apparatus of FIG. 1 comprises a carriage, a plurality of picker device 124, sensing means 122, and a driving source 120.

The surface mounting apparatus having the above construction is operated so that the sensing means 122 senses the devices so as to simultaneously pick up the electronic devices. However, in the conventional apparatus, driving means and peripheral apparatus for moving the mounter head are not provided. That is, each mounter head is constructed to be simultaneously moved by the driving source 120. Therefore, the conventional nozzle installed at the mounter head simultaneously moves corresponding to the pitch of the surface mounting device supplied to the feeder. However, in the case of a tray feeder in which the device size inserted therein to is different, respectively, a small device inserted into the tray may have a narrow pitch. Further, because a larger-sized device has a wider pitch it is very difficult to suck the device using the conventional nozzle.

Because the nozzle is designed to have the same pitch, it works well with a supply of same pitch devices. However, productivity deteriorates when devices having a different pitch device are supplied.

SUMMARY OF THE INVENTION

Accordingly, the present invention has been invented to solve the above problems and it is an object of the present invention to provide a mounter head for a surface mounting apparatus in which the precision of the R-axis rotation is increased by providing a driving means for rotating the nozzle shaft so that the device is correctly sucked and mounted.

Another object of the present invention is to provide a mounter head for a surface mounting apparatus which is capable of being applied to a tray feeder having therein a supply of same pitch devices, as well as to a tray feeder having therein a supply of devices each having a different pitch.

To accomplish the above objects, the present invention provides a mounter head for a surface mounting apparatus comprising a rack block having a rack which is movable up and down by a pinion rotated by a driving source, a nozzle shaft installed at one side of a moving means, a nozzle secured to a lower end of the nozzle shaft for sucking a device to be mounter, and a driving source installed corresponding to each nozzle shaft for rotating each nozzle.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 1:
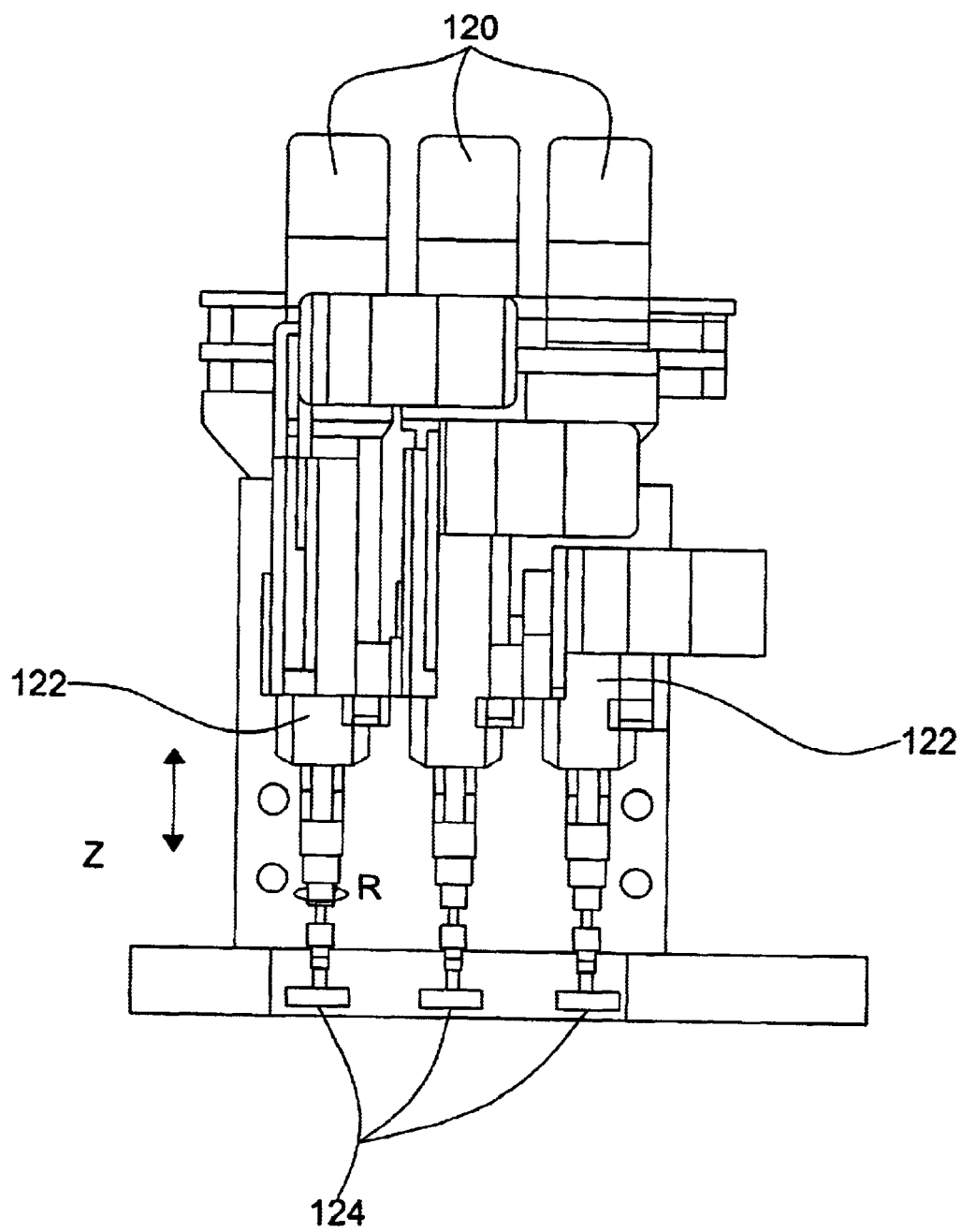
FIG. 1 shows a structure of a mounter head of conventional surface mounting apparatus.
Figure 2:
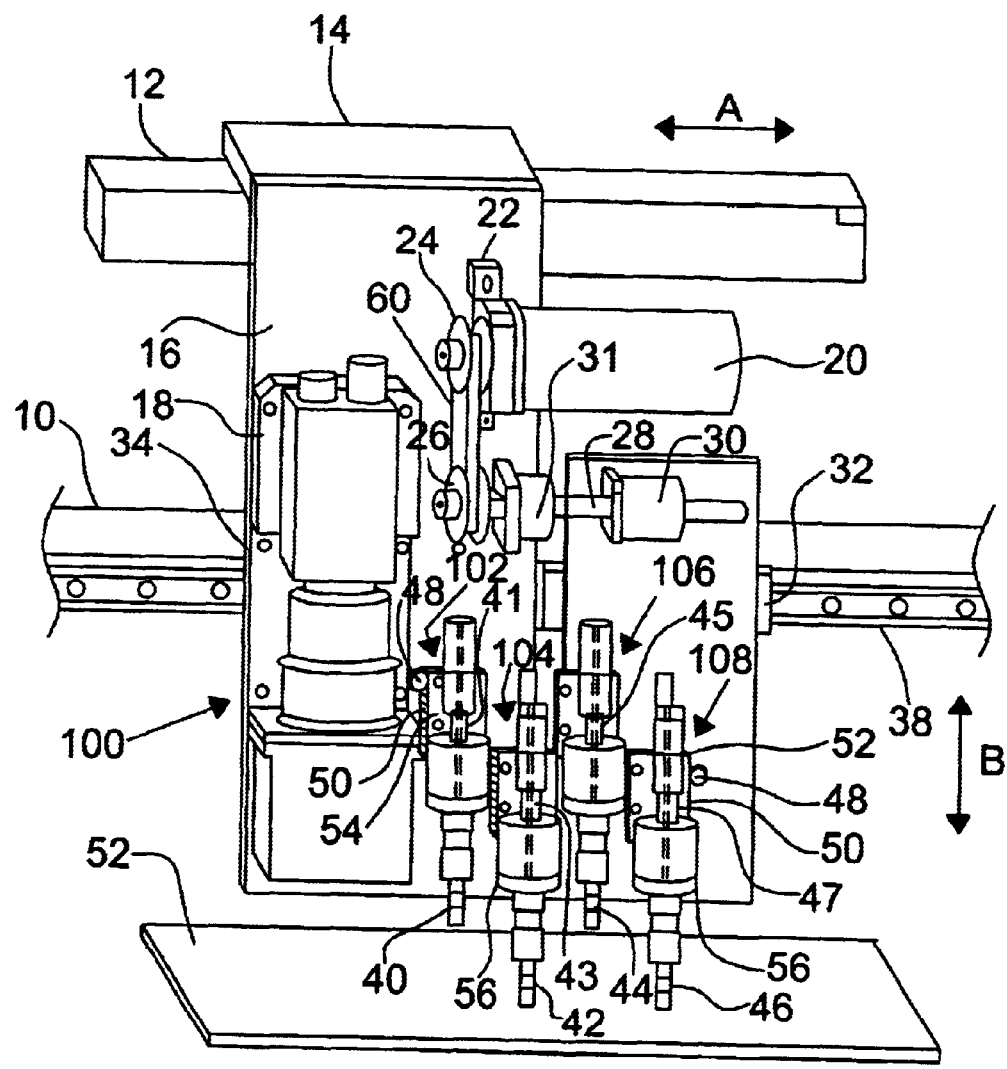
FIG. 2 is a perspective view showing a structure of a mounter head for a surface mounting apparatus according to the present invention.
Figure 3:
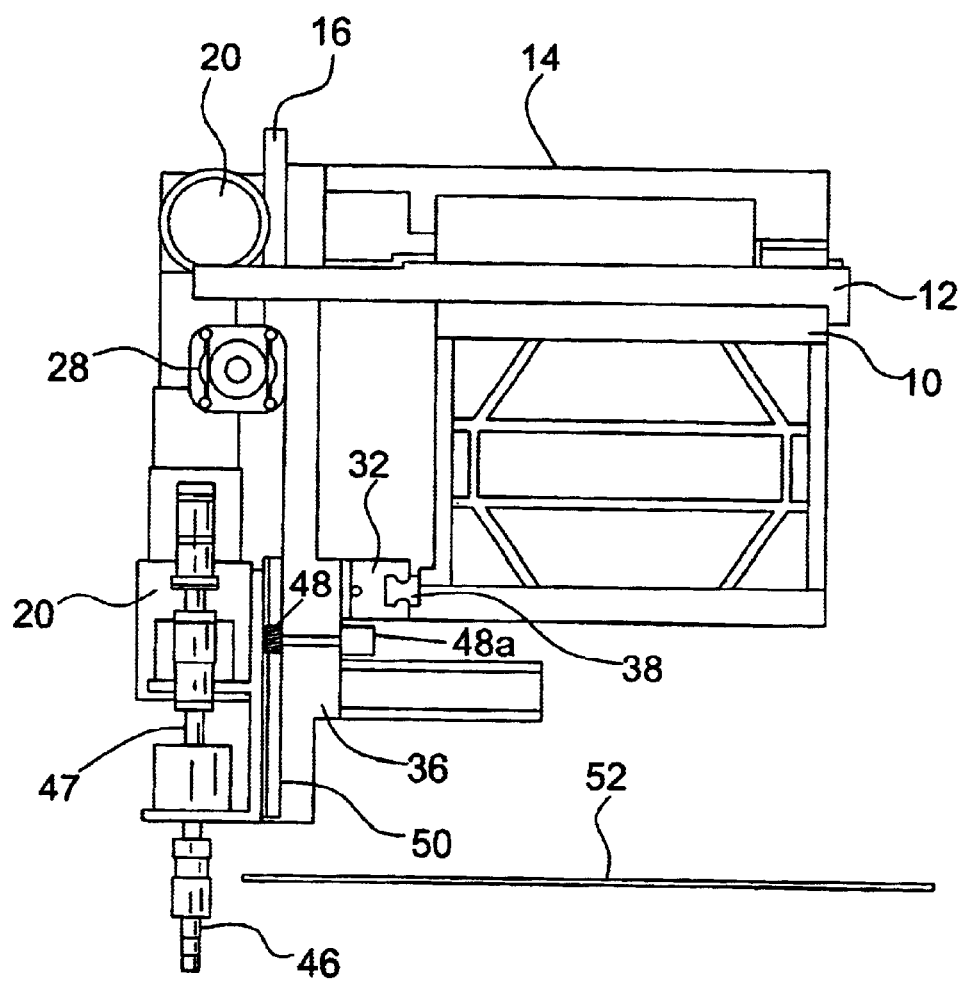
FIG. 3 is a side view showing a structure of a mounter head for a surface mounting apparatus according to the present invention.

The mounter head of a surface mounting apparatus according to the present invention is, as shown in FIGS. 2 and 3, constructed so that a fixing block 12 is disposed extending transversely and a moving block 14 is disposed to move in left and right directions along the fixing block 12, as indicated by arrow A in FIG. 2. A right plate 16 is disposed at the front portion of the moving block 14.

The plate 16 is, at a front left side thereof, provided with a support plate 18. The support plate 18 is, at a front portion thereof, provided with a camera 100 for informing a user of the position of a device to be mounted on the PCB 52. Furthermore, the plate 16 is, at a front right upper portion thereof, provided with a bracket 22 secured thereto. A driving motor 20 is mounted on the bracket 22 and extends transversely to the right of the bracket 22. The driving motor 20 is provided with a belt pulley 24. The driving motor 20 is, at a lower portion thereof, provided with a ball screw nut 31 to move in the left and right directions. The ball screw nut 31 can move in the left and right directions because the ball screw 28 is coupled to the belt pulley 26.

The plate 16, at a right portion thereof, extends parallel to a moving plate 36, as shown in FIG. 3, which is secured to the ball screw nut 30 inserted on the ball screw 28. The plate 16 and the moving plate 36 are, at a rear portion thereof, provided with LM blocks 32 and 34, respectively, which are coupled to the X-axis frame 10 to slidingly move in the left and right directions, the direction of Arrow A in FIG. 2.

Meanwhile, the pulley 24 disposed at one side of the motor 20 and the pulley 26 disposed at one side of the ball screw nut 31 are connected to the belt 60. The pulleys 24 and 26 are rotated by driving the motor 20, thereby rotating the ball screw 28. The plate 16, is at a lower portion thereof, provided with a pair of rack blocks 54 each formed with a rack 50 at one side. The rack blocks 54 are disposed adjacent to one another. The rack 50 is configured to engage with pinion 48. When the pinion 48 is rotated by a driving source 48a the rack block 54 coupled to the pinion 48 via the rack 50 moves up and down.

The rack blocks 54 are, at a lower end thereof, provided with a first nozzle shaft 41 and a second nozzle shaft 43, respectively, which are provided with a first nozzle 40 and a second nozzle 42, respectively. The first nozzle shaft 41 and the second nozzle shaft 43 are, at center portions thereof, provided with a driving motor 56, which rotates the first nozzle shaft 41 and the second nozzle shaft 43, respectively, thereby rotating the first nozzle 40 and the second nozzle 42, respectively.

The driving motors 56 are, at center portions thereof, each provided with a through-hole, and the first, second, third, and fourth nozzle shafts 41, 43, 45, and 47 are, at a center portion thereof, provided with a through-hole (not shown) which communicates with a through-hole formed in the nozzles 40, 42, 44 and 46.

The moving plate 36 is provided with the third nozzle shaft 45 and the fourth nozzle shaft 47, which have the same height as the first nozzle shaft 41 and the second nozzle shaft 43. The moving plate 36 is, a front portion thereof, provided with a pair of rack block 54 configured to move up and down, which are each attached to a rack 50. The rack 50 engages with the pinion 48. The pinion 48 is rotated by a driving source and enables the engaging rack 50 to be moved to thereby move the rack block 54 up and down in a direction shown by Arrow B in FIG. 2.

Further, the rack blocks 54 are, at a lower end thereof, provided with the third nozzle shaft 45 and the fourth nozzle shaft 47, respectively, which are provided with the third nozzle 44 and the fourth nozzle 46, respectively. The third nozzle shaft 45 and the fourth nozzle shaft 47 are, at center portions thereof, each provided with driving motor 56. When the driving motor 56 is rotated, the third nozzle shaft 45 and the fourth nozzle shaft 47 are rotated, thereby rotating the third nozzle 44 and the fourth nozzle 46.

The mounter head according to the present invention is constructed so that the first nozzle 40, the second nozzle 42, the third nozzle 44, and the fourth nozzle 46 are disposed at a lower end of the first nozzle shaft 41, the second nozzle shaft 43, the third nozzle shaft 45, and the fourth nozzle shaft 47, respectively. The first nozzle shaft 41, the second nozzle shaft 43, the third nozzle shaft 45 and the fourth nozzle shaft 47 are each disposed on a rack block 54. The nozzle shafts 41, 43, 45, and 47 are, at center portions thereof, provided with a driving motor 56 which rotates the respective nozzle shafts 41, 43, 45 and 47. By rotating the nozzle shafts 41, 43, 45, and 47, the nozzles 40, 42,44, and 46 disposed, respectively, at lower ends thereof each rotates about its respective axis.

The nozzles 40, 42, 44 and 46 accurately suck the device from a feeder (not shown). When the nozzles 40, 42, 44 and 46 mount the device on the PCB, the backlash due to a time difference between the respective nozzle axes can be prevented, and at the same time, the device can be mounted in transversal and longitudinal directions and at various angles.

Meanwhile, the pulley 24 provided at the driving motor 20 and the pulley 26 provided at the ball screw 28 connected to each other by belt 60. By rotating the driving motor 20, the ball screw 28 connected to the belt 60 rotates, thereby moving the plate 36 in the left and right directions.

The plate 16 is, at a lower right portion, further provided with a first nozzle assay 102 and a second nozzle assay 104, which are disposed on the pair of rack blocks 54. The moving plate 36 is provided with a third nozzle assay 106 and a fourth nozzle assay 108 corresponding to the first nozzle assay 102 and the second nozzle assay 104 of the plate 16. The first nozzle assay 102, the second nozzle assay 104, the third nozzle assay 106, and the fourth nozzle assay 108 comprise the first nozzle 40, the second nozzle 42, the third nozzle 44, and the fourth nozzle 46, as well as the first nozzle shaft 41, the second nozzle shaft 43, the third nozzle shaft 45, and the fourth nozzle shaft 47, and the driving motor 56 corresponding to each nozzle shaft.

By rotating the driving motor 20, the pulleys 24 and 26 connected to the belt 60 rotate. The ball screw 28 is rotated so that the plate 36 is moved along the X-axis frame 10 in a straight line. The distance between the first nozzle assay 102 and the second nozzle assay 104, and the third nozzle 106 and the fourth nozzle assay 108 becomes larger and the pitch is changed by a predetermined amount corresponding to a pitch of the device being supplied.

The above descriptions correspond to the case in which the pitch of the device to be mounted is large. However, by rotating the driving motor 20 in forward and reverse directions, the moving plate 36 provided with the third nozzle assay 106 and with the fourth nozzle assay 108 can move in the left and right directions, thereby easily accommodating a small pitch device.

According to the present invention, precision is improved by removing backlash caused by a belt, and a tact time can be shortened because different-sized devices can be easily picked up. Further, because the mounter head can be controlled to suck and pick-up a device having a narrow or large pitch, many devices can be served.

Having described specific preferred embodiment of the invention with reference to the accompanying drawings, it is to be understood that various changes and modifications may be effected therein by one skilled in the art without departing from the scope or spirit of the invention as defined in the appended claims.

What is claimed is:

1. A mounter head for a surface mounting apparatus, comprising:

a moving block movable in a first direction;

at least one first rack block, each of the at least one first rack block being mounted on a first rack disposed on the moving block and configured to be movable up and down on the first rack by a respective first drive source;

a nozzle shaft mounted on each of the at least one first rack block, wherein a nozzle is secured to a lower end of each nozzle shaft and is adapted for picking up a component to be mounted;

a moving plate disposed adjacent to the moving block;

at least one second rack block, each at least one second rack block being mounted on a second rack disposed on the moving plate and configured to be movable up and down on the second rack by a respective first drive source;

a nozzle shaft mounted on each of the at least one second rack block, wherein a nozzle is secured to a lower end of each nozzle shaft and is adapted for picking up a component to be mounted; and a moving unit configured to move the moving plate in the first direction to vary a distance between the moving block and the moving plate, thereby varying a distance between the at least one first rack block and the at least one second rack block.

2. The mounter head according to claim 1, wherein the at least one first rack block comprises two first rack blocks and the at least one second rack block comprises two second rack blocks.

3. The mounter head according to claim 1, wherein the nozzle shaft mounted on each of the at least one first rack block and at least one second rack block is rotatable about its central longitudinal axis by a respective second drive source.

4. The mounter head according to claim 3, wherein the second drive source is a servo motor.

5. The mounter head according to claim 1, wherein the moving unit comprises:

a ball screw;

a ball screw nut mounted on each of the moving block and the moving plate and engaged with the ball screw; and a drive unit configured to rotate the ball screw.

6. The mounter head according to claim 5, wherein the drive unit comprises:

a first pulley mounted on the ball screw;

a second pulley mounted on a driving motor; and a belt extending between the first and second pulleys.

7. The mounter head according to claim 1, wherein the moving block and moving plate each comprise a linear movement block engaged with a rail and are configured to be moveable in the first direction along the rail.

8. A mounter head for a surface mounting apparatus, comprising:

a moving block movable in a first direction;

at least one first rack block having a first rack disposed on the moving block and the first rack is configured to be movable up and down;

a moving plate disposed adjacent to the moving block;

at least one second rack block having a second rack disposed on the moving plate and the second rack is configured to be movable up and down;

a nozzle shaft mounted on each of the at least one first rack block and each of the at least one second rack block, the nozzle shaft having a nozzle secured to a lower end thereof; and a moving unit configured to move the moving plate in the first direction to vary a distance between the moving block and the moving plate, thereby varying a distance between the at least one first rack block and the at least one second rack block.

9. The mounter head according to claim 8, wherein the at least one first rack comprises two first rack blocks and the at least one second rack block comprises two second rack blocks.

10. The mounter head according to claim 8, wherein the nozzle shaft mounted on each of the at least one first rack block and at least one second rack block is rotatable about its central longitudinal axis by a respective second drive source.

11. The mounter head according to claim 8, wherein the moving unit comprises:

a ball screw;

a ball screw nut mounted on each of the moving block and the moving plate and engaged with the ball screw; and a drive unit configured to rotate the ball screw.

12. The mounter head according to claim 11, wherein the drive unit comprises:

a first pulley mounted on the ball screw;

a second pulley mounted on a driving motor; and a belt extending between the first and second pulleys.

13. The mounter head according to claim 8, wherein the moving block and moving plate each comprise a linear movement block engaged with a rail and are configured to be moveable in the first direction along the rail.

* * * * *